United States Patent [19]

Liang et al.

[11] 4,346,512

[45] Aug. 31, 1982

[54] INTEGRATED CIRCUIT MANUFACTURING METHOD

[75] Inventors: Victor K. C. Liang, San Jose; Bernard Bouyssounouse, Palo Alto; Ernest W. Yim, Sunnyvale, all of Calif.

[73] Assignee: Raytheon Company, Lexington, Mass.

[21] Appl. No.: 146,548

[22] Filed: May 5, 1980

[51] Int. Cl.³ ............................................ H01L 21/22
[52] U.S. Cl. .................................. 29/571; 29/577 C; 148/187
[58] Field of Search ............. 29/571, 577 C; 148/1.5, 148/187, 175

[56] References Cited

U.S. PATENT DOCUMENTS

| | | | |
|---|---|---|---|
| 3,766,637 | 10/1973 | Norris et al. | 29/578 X |
| 3,983,620 | 10/1976 | Spadea | 29/571 |
| 4,046,606 | 9/1977 | Lambert | 148/187 |
| 4,138,782 | 2/1979 | Dela Moneda et al. | 29/577 C |
| 4,235,011 | 11/1980 | Butler et al. | 29/571 |
| 4,280,271 | 7/1981 | Lou et al. | 148/187 X |

Primary Examiner—G. Ozaki

Attorney, Agent, or Firm—Richard M. Sharkansky; Joseph D. Pannone

[57] ABSTRACT

A method for forming bipolar semiconductor devices and complementary metal-oxide semiconductor (CMOS) field effect devices on a single crystal substrate wherein source and drain contact regions of one of the CMOS devices is formed simultaneously with the formation of a base region of the bipolar device and source and drain contact regions of the other one of the CMOS devices are formed simultaneously with the emitter region of the bipolar device. Because the emitter region is formed with a relatively high doping concentration and since the source and drain contact regions are formed simultaneously with the same relatively high doping concentration, the process includes the step of covering the surfaces of these source and drain contact regions during thermal growth of a gate oxide on the portions of the surface of the semiconductor between the source and drain contact regions to prevent dopant in the source and drain contact regions from entering the surface of the semiconductor between source and drain contact regions during the thermal growth of the gate oxide.

8 Claims, 17 Drawing Figures

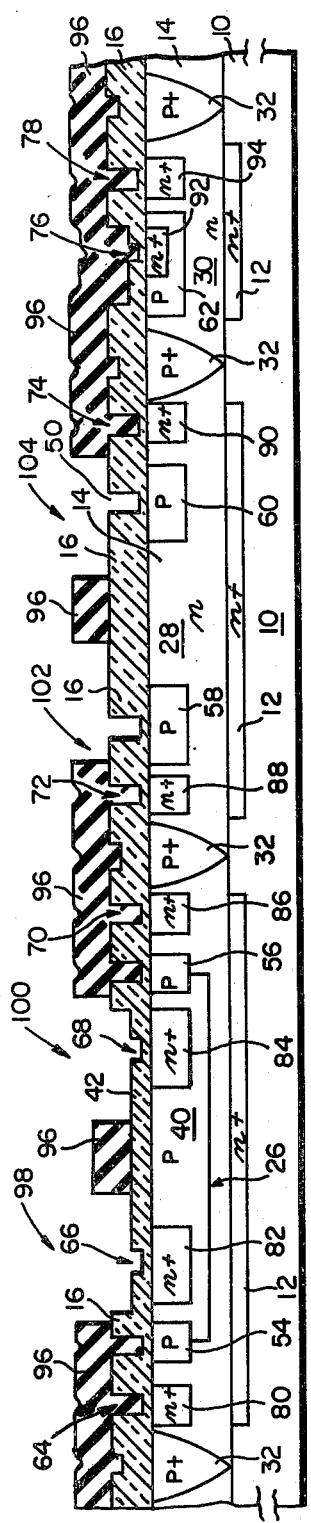

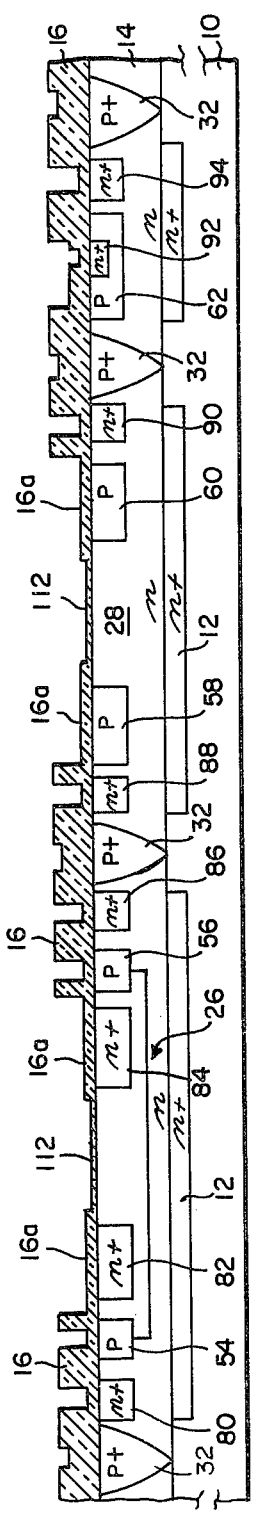
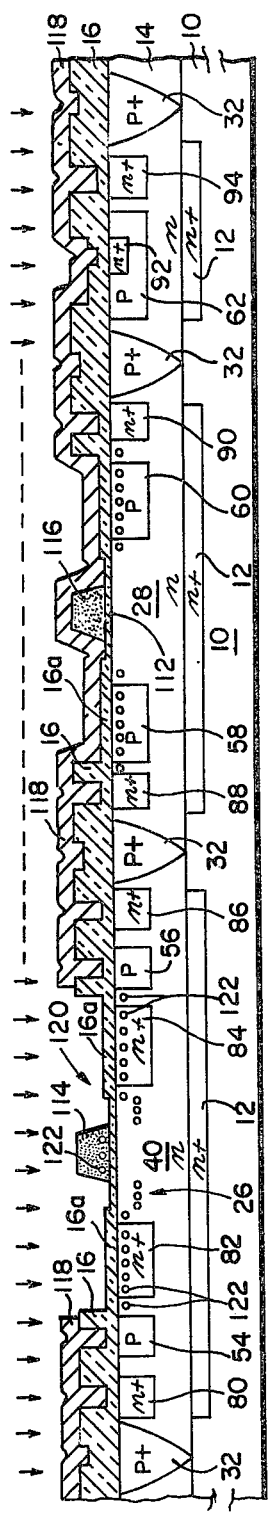
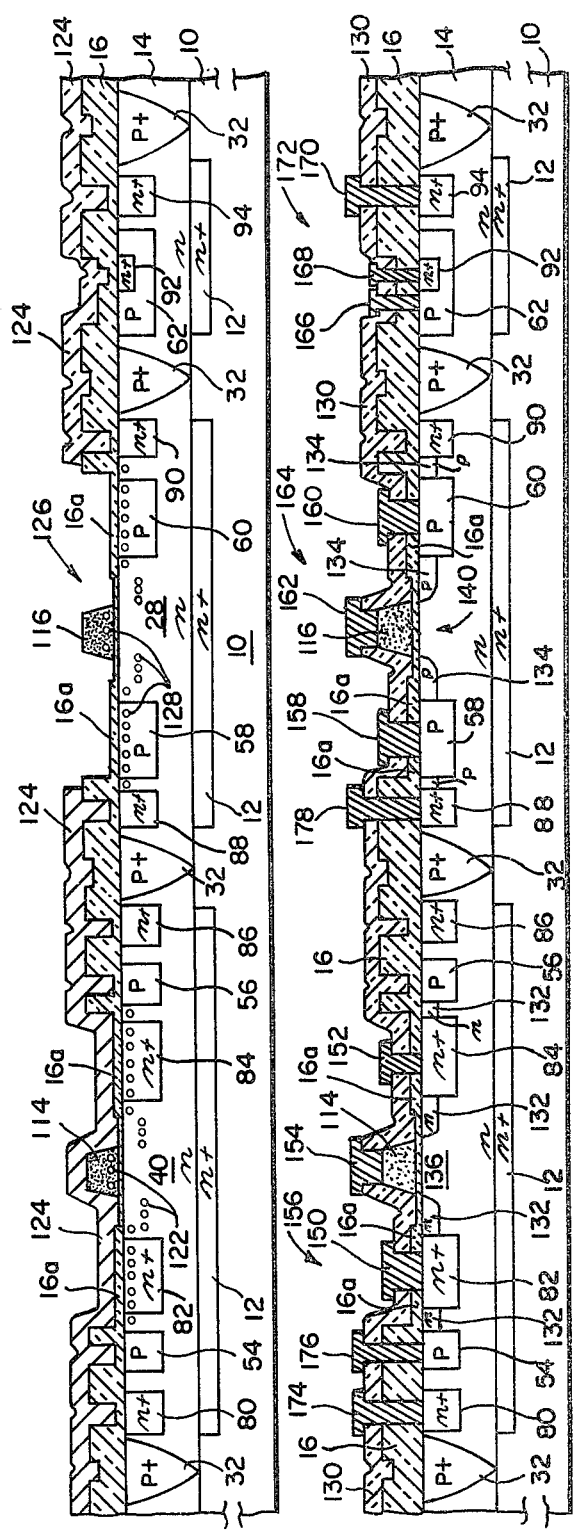
FIG. 9
FIG. 10
FIG. 11
FIG. 12

INTEGRATED CIRCUIT MANUFACTURING METHOD

BACKGROUND OF THE INVENTION

This invention relates generally to integrated circuit manufacturing methods and more particularly to methods for manufacturing integrated circuits having both bipolar devices and complementary metal-oxide-semiconductor (CMOS) silicon gate field effect devices formed on a single crystal substrate.

As is known in the art many integrated circuits have been made using bipolar transistor devices and many other integrated circuits have been made using CMOS field effect devices. Bipolar devices provide excellent performance in linear integrated circuits, such as in amplifier circuits, whereas CMOS devices provide excellent performance in switching or logic circuits. In many applications it is therefore desirable to use circuits which employ both bipolar devices and CMOS devices, such as digital to analog converters. In such application, however, the bipolar devices are generally formed as one chip or integrated circuit and the CMOS devices are formed as a second chip, the two chips then being electrically interconnected by a printed circuit board. In order to reduce the size of the converter it would be desirable to form both the bipolar devices and the CMOS devices on a single chip; however, because the processing requirement in forming both types of devices are not readily compatible, methods used to provide such single chip on a commercially practical basis have generally not heretofore been successful.

SUMMARY OF THE INVENTION

In accordance with the present invention a bipolar transistor and complementary metal-oxide-semiconductor (CMOS) devices are formed on a single crystal substrate. The process used to form such devices integrates processes steps such that doped regions of the CMOS devices are formed simultaneously with doped regions of the bipolar device. In particular, source and drain contact regions of a p-channel enhancement mode field effect transistor (FET) are formed simultaneously in a semiconductor with the base region of a bipolar transistor. Subsequently, source and drain contact regions of an n-channel enhancement mode FET are formed in the semiconductor simultaneously with the formation of the emitter region of the bipolar transistor. An insulating layer is formed on spaced portions of the surface of the semiconductor over the source and drain contact regions of the n-channel enhancement mode FET. The structure is then heated to grow a gate oxide layer over the gate region of the device, i.e., the portion of the surface of the semiconductor between the spaced portions of the insulating layer. With such method the source and drain contact regions of the n-channel enhancement mode FET may be formed simultaneously with the same high doping concentration (in excess of $10^{19}$ atoms per cm$^3$) as the emitter region; the spaced regions of the insulating layer cover the highly doped source and drain contact regions so that the dopant in the highly doped source and drain contact regions is prevented from entering the surface region of the semiconductor between such source and drain contact regions during the heating process used to form the gate oxide. A polycrystalline silicon gate is subsequently formed over the gate oxide. The structure is then selectively implanted with particles capable of establishing n-type doped regions in the semiconductor and in the polycrystalline silicon gate. The structure is then heated to activate such particles and create n-type conductivity regions to electrically connect the source and drain contact regions to the gate region disposed beneath the doped, polycrystalline silicon gate electrode.

While such technique enables the simultaneous formation of source and drain contact regions of a field effect transistor and the emitter region of a bipolar transistor such technique may be used in forming field effect transistors having highly doped source and drain contact regions thereby to provide such devices with regions which can make good ohmic contact with its source and drain electrodes.

BRIEF DESCRIPTION OF THE DRAWINGS

The foregoing features of this invention, as well as the invention itself, may be more fully understood from the following detailed description read together with the accompanying drawings, in which:

FIGS. 1–12 are cross sectional elevational views of bipolar and CMOS devices at various steps in the manufacture thereof; and FIGS. 5A–9A show a portion of one of the CMOS devices in FIGS. 5 to 9, respectively.

DESCRIPTION OF THE PREFERRED EMBODIMENTS

Figure 1:
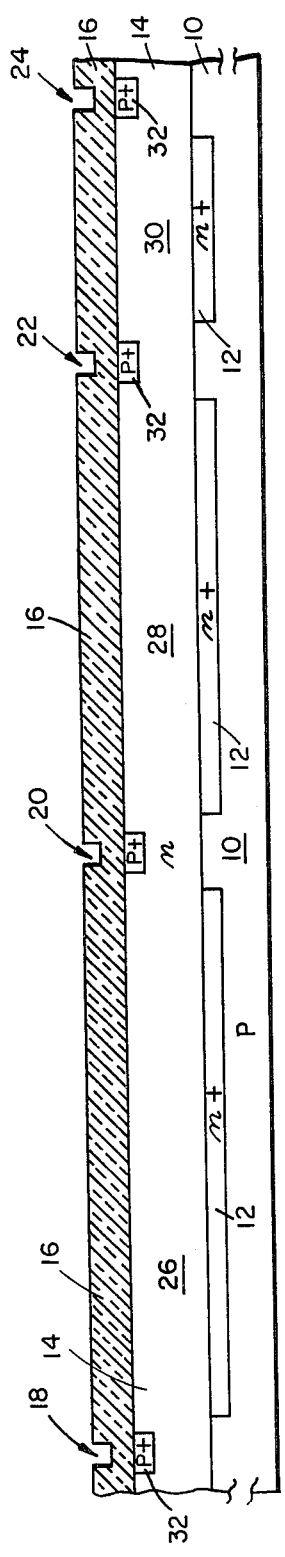

Referring now to FIG. 1, a p-type silicon substrate 10 is shown having a resistivity here 10 to 20 ohm-cm. The upper surface of such substrate 10 has n+ type conductivity buried layer regions 12 formed therein using conventional diffusion processing techniques. An n-type conductivity epitaxial layer 14 of silicon is then formed over the surface of the substrate 10, as shown. Here the thickness of the epitaxial layer 14 is 13 to 16 micrometers and the resistivity of such epitaxial layer 14 is here 4 to 6 ohm-cm. An insulating layer 16, here of silicon dioxide, is formed over the surface of the epitaxial layer 14, here to a thickness of 1.2 micrometers, using conventional chemical vapor deposition or thermal oxidation techniques. The insulating layer 16 is then selectively masked and etched, using conventional photolithographic-chemical etching techniques, to form windows 18, 20, 22, and 24 which expose portions of the surface of the epitaxial layer 14 whereby isolated regions 26, 28 and 30 are to be formed. As will be described hereinafter, isolated region 26 will have formed therein an n-channel, enhancement mode, silicon gate field effect transistor; isolated region 28 will have formed therein a p-channel, enhancement mode, silicon gate field effect transistor; and isolated region 30 will have formed therein a bipolar transistor.

A p-type dopant, here boron, having a surface concentration of $10^{20}$ atoms/cm$^3$ is diffused through windows 18, 20, 22 and 24 into exposed portions of the epitaxial layer 14 to form p+ type doped regions 32, as shown. It should first be noted that the boron is diffused only partially into the epitaxial layer 14, here to a depth in the order of 3 micrometers; however, in a later heating step such boron will be driven down into the substrate 10 to form p-type conductivity isolation regions 32. It is also noted that during this diffusion process a layer of silicon dioxide grows over the portions of the silicon epitaxial layer 14 exposed by windows 18, 20, 22 and 24, as shown. Here the silicon dioxide layer is grown in such windows 18 to 24 to a thickness 0.6 micrometers.

Figure 2:
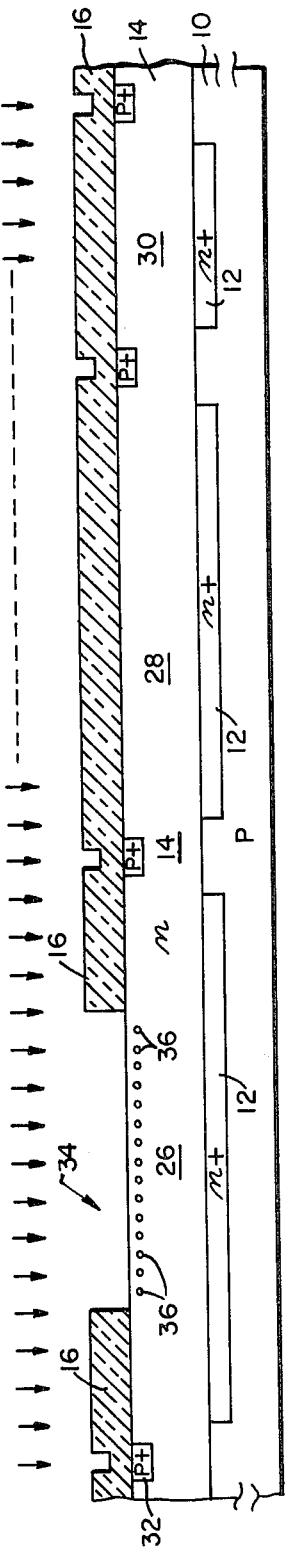
Figure 3:
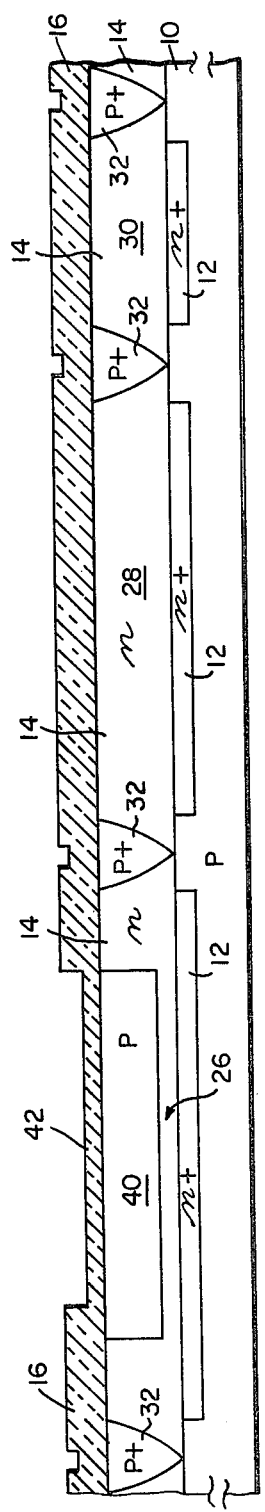

Referring now to FIG. 2, a window 34 is formed in a portion of the silicon dioxide layer 16 disposed over a portion of region 26, as shown, using conventional photolithographicchemical etching processing. Then regrown, by thermal oxidation is a thin silicon dioxide layer, not shown, here 1200 angstroms thick. The surface of the structure thus formed is exposed to boron ions, as indicated by the arrows (not numbered), using conventional ion implantation techniques. The boron ions, 36, are here implanted at 60 Kev with a concentration here of $1.5 \times 10^{13}$ atoms/cm$^2$ so that the silicon dioxide layer 16, including the portions of the silicon dioxide layer grown over p-type conductivity regions 32, prevents such boron ions from penetrating into the epitaxial layer 14 disposed beneath such silicon dioxide layer 16, thereby resulting in the selective implantation of boron ions 36 in the portion of the epitaxial layer 14 exposed by window 34, as shown. The structure thus formed is then heated for about five hours at 1200° C. to activate the implanted boron ions 36 and drive such activated boron ions into the epitaxial layer 14 and thereby form a p-type conductivity region 40 here having a surface concentration of $2 \times 10^{16}$ atoms/cm$^3$ (FIG. 3); to drive the p-type conductivity dopant in regions 32 (FIG. 3) down to the substrate 10, as shown in FIG. 3, to electrically isolate regions 26, 28 and 30; and to anneal the portion of the epitaxial layer 14 exposed by window 34 (FIG. 2). During this heating step a layer 42 of silicon dioxide is grown over the portion of the silicon epitaxial layer exposed by window 34 (FIG. 2), here such layer 42 being grown to a thickness of 6000 angstroms.

Figure 4:
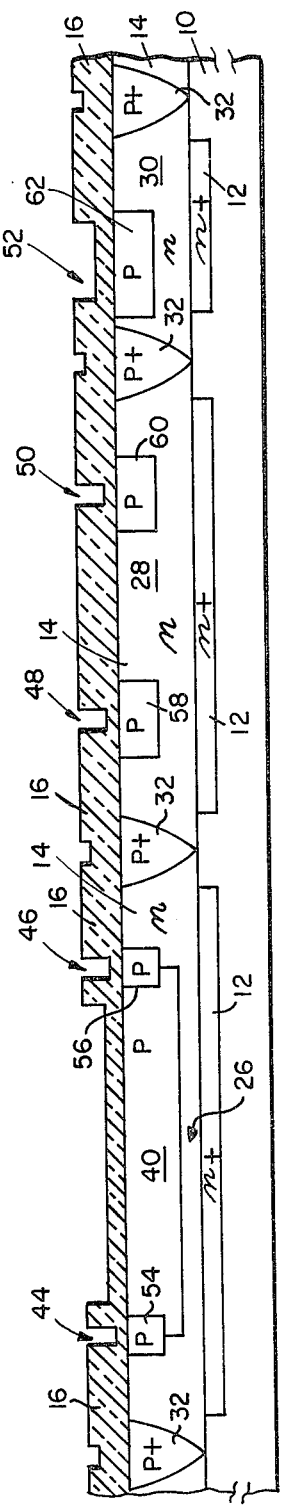

Referring now to FIG. 4, windows 44, 46, 48, 50, 52 are formed in selected portions of the silicon dioxide layer 16 using conventional photolithographic-chemical etching techniques to expose underlying portions of the epitaxial layer 14. A suitable p-type dopant, here boron, is diffused simultaneously through windows 44, 46, 48, 50, 52 into the exposed portions of the epitaxial layer 14 to form p-type conductivity regions 54, 56, 58, 60, 62 as shown. Here such p-type regions 54, 56, 58, 60, 62 have a boron concentration to provide such regions 54 to 62 with a resistivity of 115 ohms per square. As will be described, the p-type conductivity regions 54 and 56 provide a channel stop, regions 58, 60 provide the source and drain contact regions for the p-channel, enhancement mode, silicon gate field effect transistor (FET) to be formed in isolated region 28 and the p-type conductivity region 62 provides the base region for the bipolar transistor to be formed in isolated region 30. It is pointed out, therefore, that the source and drain contact regions for the p-channel enhancement mode FET, (i.e., regions 58 and 60) are formed simultaneously with the formation of the base region of the bipolar transistor (i.e., region 62).

Figure 5A:
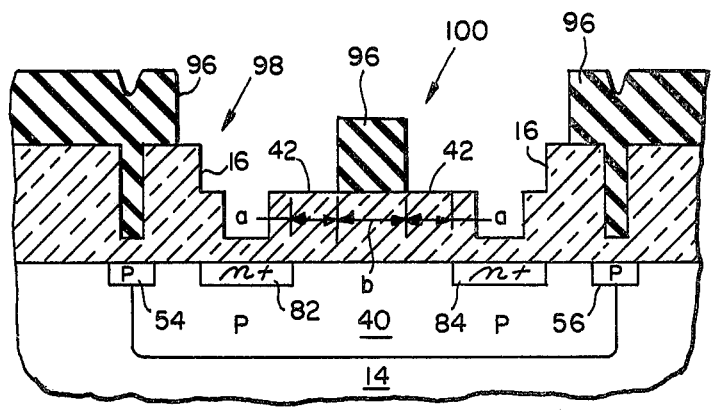

Referring now to FIG. 5, windows 64, 66, 68, 70, 72, 74, 76 and 78 are formed in portions of the silicon dioxide layers 16, 42 to expose underlying portions of the silicon epitaxial layer 14. A suitable n-type dopant, here phosphorus, is simultaneously diffused through the windows 64, 66, 68, 70, 72, 74, 76 and 78 into the exposed portions of the epitaxial layer 14 to form n+ type conductivity regions 80 to 94 as shown. Here such regions 80 to 94 have surface doping concentrations from $5 \times 10^{19}$ to $10^{21}$ atoms/cc, here $10^{20}$ atoms/cc. As will be described, the n+ type conductivity regions 82 and 84 provide the source and drain contact regions for the n-channel enhancement mode silicon gate FET to be formed in isolated region 26 and the n+ type conductivity region 92 provides the emitter region of the bipolar transistor to be formed in isolated region 30. It is pointed out, therefore, that the source and drain contact regions of the n-channel enhancement mode FET (i.e., regions 82 and 84) are here formed simultaneously with the formation of the emitter region of the bipolar transistor (i.e., region 92). It is noted that during the diffusion process a layer of silicon dioxide is grown over the portions of the silicon epitaxial layer 14 exposed by windows 64 to 78 as shown in FIG. 5. Here the thickness of such grown silicon dioxide layer is about 2000 Angstroms. It is also noted that n+ type conductive regions 80, 86, 88 and 90 provide for contact regions to the n-type epitaxial layer 14. Further, n+ type conductivity region 94 provides for the collector contact to the epitaxial layer 14.

Figure 6A:
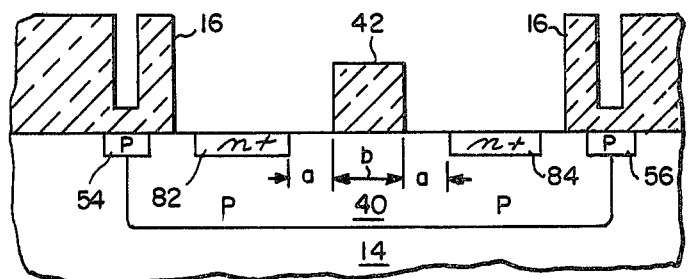

A mask is then formed over the surface of the structure by first depositing a layer 96 of photoresist and then patterning such photoresist layer 96 using conventional techniques to form a pair of windows 98 and 100 over isolated region 26, and a pair of windows 102 and 104 over isolated region 28, as shown. More particularly, windows 98, 100, 102 and 104 expose portions of the silicon dioxide layers 16, 42 disposed over the source and drain contact regions of the FET's to be formed in regions 26 and 28 while portions of the photoresist layer 96 remain over the gate regions for such transistors. The patterns of the photoresist layer 96 formed over regions 26 and 28 are similar, the pattern formed over region 26 being shown in detail in FIG. 5A. It is noted in FIG. 5A that the portion of the photoresist layer 96 disposed over the gate region has a width "b", here 12.5 micrometers, and has each edge thereof separated from the edge of the n+ type regions 82 and 84 a length "a". Diluted hydrofluoric acid, is brought into contact with the portions of the silicon dioxide layers 16, 42 exposed by windows 98, 100, 102, and 104 (FIG. 5) to selectively remove such exposed portions of the silicon dioxide layers 16, 42 down to the surface of the silicon epitaxial layer 14 as shown in FIG. 6 (and in detail, for the FET being formed in region 26, in FIG. 6A). It is noted that the edges of the silicon dioxide layer 42 disposed over the gate region are separated from the edges of the n+ type regions 82 and 84, the length "a", (FIG. 6A) here, as noted above, 5.0 micrometers. Further, the width of the portion of the silicon dioxide layer 42 over the gate region is "b", here 12.5 micrometers.

Figure 7A:
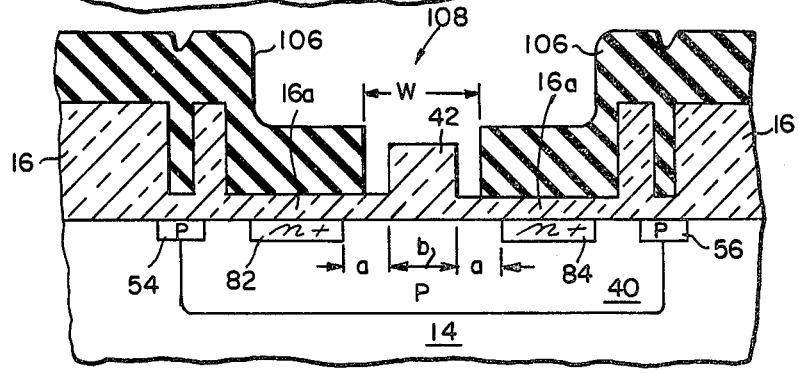
Figure 8A:
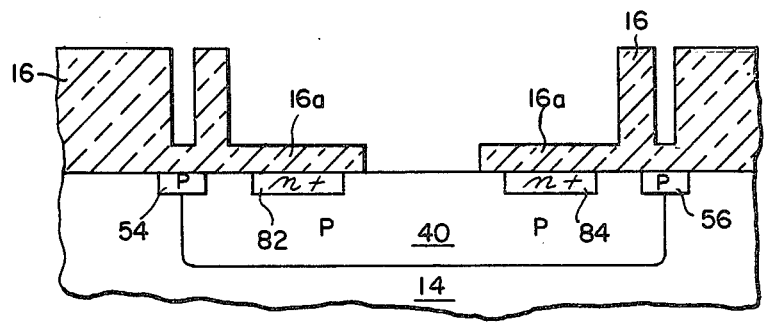

Next, referring to FIG. 7a, thin layer 16a of silicon dioxide is grown in a heated wet oxygen environment, here at 900° C., in a conventional manner over the exposed portions of the silicon epitaxial layer 14, as shown. Here such grown layers 16a are formed with a thickness of 700 to 1000 Angstroms. It is noted that silicon dioxide layer 42 over the region between the source and drain contact regions 82, 84 has been formed to prevent dopant in these contact regions from entering the surface portion of the semiconductor disposed beneath the silicon dioxide layer 42. Next, a mask formed in a conventional manner from a layer 106 of photoresist is provided over the surface of the structure thus formed, such mask having windows 108 and 110 as shown to expose the gate regions for the FET's being formed in regions 26 and 28, as shown in FIG. 7. It is noted that the windows 108 and 110 have the same relationship with respect to the source and drain contact regions, i.e., regions 82, 84 and 58, 60, such relationship with respect to regions 82 and 84 being shown in detail in FIG. 7A. As noted above, the sides of the portion of the silicon dioxide layer 42 disposed over the gate region are separated from the sides of the n+ type regions 82 and 84 the length "a", here 5 micrometers. The window 108 is formed with a width W, equal to the sum of the length of the portion of the silicon dioxide layer 42 disposed over the gate region (i.e., the length "b") and the length "a". That is, the width of the window 108, W, is (a+b), here 17.5 micrometers. It follows then that the photoresist layer 106 covers the portion of the silicon dioxide layer, 16a disposed over n+ regions 82 and 84 and overlaps such regions 82 and 84 with length (a/2). Next, a suitable chemical etchant, here diluted hydrofluoric acid is brought into contact with the exposed portions of the silicon dioxide layers 16a and 16, to remove such exposed portions of such silicon dioxide layer 16 and 16a and thereby expose the underlying silicon epitaxial layer 14 as shown in FIGS. 8 and 8A.

Figure 9A:
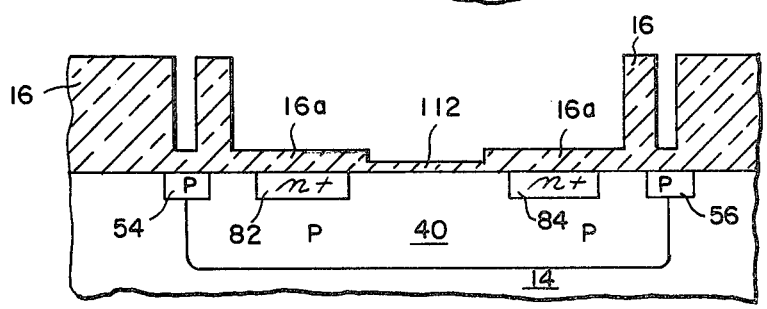

Referring now to FIGS. 9 and 9A, a thin silicon dioxide layer 112 is thermally grown over the exposed surface of the silicon epitaxial layer 14, as shown. Such thin silicon dioxide layer 112 here has a thickness of 1200 Angstroms and forms the gate oxide layer for the n-channel and p-channel FETs being formed in isolated regions 26 and 28. The thin silicon dioxide layer 112 is thermally grown in a wet oxygen atmosphere at a temperature of about 900° C. It is noted that during the growth of this thin silicon dioxide layer 112 the n+ type doped regions 82 and 84 have their surfaces covered by the silicon dioxide layer 16a. This covering prevents the n-type dopant in the heavily doped n+ regions 82 and 84 from entering the surface of the semiconductor between the source and drain contact regions 82, 84 of the n-channel silicon gate FET being formed in region 26.

Because these source and drain contact regions 82, 84 are formed simultaneously with the emitter region 92 and because the emitter region 92 must be formed with a high doping concentration, typically in excess of $10^{19}$ atoms per $cm^3$ we have discovered that forming the source and drain contact regions 82, 84 with this same high concentration lead to the formation of a depletion mode field effect device rather than the desired enhancement FET because dopant in the highly doped source and drain contact regions 82, 84 enters the portion of the semiconductor surface region between the source and drain contact regions 82, 84 during the time such surface is heated to form the thin gate oxide layer 112. More particularly, when the source and drain contact regions 82, 84 were formed with the same high doping concentration of the emitter region 92, devices formed without covering the source and drain contact regions 82, 84 with silicon dioxide layers 16a (FIG. 9A) were unable to achieve a positive threshold voltage of 1.2 to 1.6 volts for the n-channel MOS device. We have discovered that covering the source and drain contact regions 82, 84 as described prevented dopant in such contact regions 82, 84 from entering the portion of the surface of the semiconductor between the source and drain contact regions during the process of heating the semiconductor for the purpose of growing a thin gate oxide 112. We discovered that covering the highly doped source and drain contact regions 82, 84 with oxide layers 16a as described prior to growing the thin gate oxide layer 112 enabled the formation of an n-channel enhancement mode FET device in region 26.

Referring now to FIG. 10 a layer of polycrystalline silicon is chemically vapor deposited over the surface of the structure thus formed and is then patterned into silicon gates 114 and 116 as shown, using conventional masking and etching techniques. A layer 118 of aluminum is then evaporated to a thickness, here of 12,000 Angstroms over the surface of the structure thus formed. The layer 118 of aluminum has a window 120 formed therein over the surface of isolated region 26, as shown. The aluminum mask is then exposed to phosphorus ions using conventional ion implantation techniques. Here the phosphorus ions 122 are implanted with about 150 Kev and a concentration of here about $2.5 \times 10^{15}$ atoms/$cm^2$. The implanted phosphorus ions 122 also become implanted into the polycrystalline silicon gate electrode 114, as shown. Next, as shown in FIG. 11 the layer 118 of aluminum is stripped using conventional techniques and is replaced with a layer 124 of aluminum, here evaporated to a thickness of 12,000 Angstroms, such layer 124 being patterned as shown to have a window 126 to expose the surface of isolated region 28. Boron ions 128 are implanted, as indicated, into the epitaxial layer 14 region surrounding the p-type conductivity regions 58 and 60. Such ions 128 are also implanted into the polycrystalline silicon gate 116, as indicated.

Referring now to FIG. 12 a layer 130 of silicon dioxide (here 8,000 Angstroms thick) is chemically vapor deposited over the surface of the structure thus formed. The structure is heated at 1010° C. for 30 minutes in $POCL_3$ to soften the deposited silicon dioxide layer 130. The structure is at the same time heated to anneal and activate the implanted phosphorus ions 122 (FIG. 11) and implanted boron ions 128 (FIG. 11) thereby forming: n-type conductivity regions 132 which electrically connect the n+ type conductivity source and drain contact regions 82 and 84 to the gate region 136 which is controlled by the polycrystalline silicon gate 114; and, p-type conductivity regions 134 which electrically connect the p+ type conductivity source and drain contact regions 58 and 60 to the gate region 140 controlled by the polycrystalline silicon gate 116. Next source, drain, gate, emitter collector and base, and other contact openings are formed in silicon dioxide layers 16 and 130 using conventional photolithographic and chemical etching techniques. A layer of aluminum is then deposited and patterned by conventional photolithographic technique into interconnect patterns and contacts to silicon and polycrystalline silicon through the openings are made. Source contact 150, drain contact 152 and gate contact 154 for the n-channel enhancement mode silicon gate FET 156; source contact 158, drain contact 160; and gate contact 162 for the p-channel enhancement mode silicon gate FET 164; and base contact 166, emitter contact 168 and collector contact 170 of bipolar transistor 172 are formed as shown. Also, as contacts 174, 176, 178 are provided for regions 80, 54 and 88 as shown.

Having described a preferred embodiment of this invention, it is now evident that other embodiments incorporating these concepts may be used. For example an insulating layer of silicon nitride material, or some other insulating material, may be formed over the source and drain contact regions 82, 84 during the formation of the thermally grown silicon dioxide layers 16a. It is felt, therefore, that this invention should not be limited to the disclosed embodiment but rather should be limited only by the spirit and scope of the appended claims.

What is claimed is:

1. A method for forming a field effect transistor and a bipolar transistor in a semiconductor comprising the steps of:
   (a) simultaneously forming source and drain contact regions of the field effect transistor and an emitter region of the bipolar transistor in the semiconductor with the same doping concentrations; and
   (b) heating the semiconductor forming an insulating layer on a surface portion of the semiconductor disposed between the source and drain contact regions while preventing dopant in the source and drain contact regions from entering the surface portion of the semiconductor between the source and drain contact regions.

2. The method recited in claim 1 including the step of forming a complementary field effect transistor, such later forming step including the step of forming the base region of the bipolar transistor and the source and drain contact regions of the complementary field effect transistor simultaneously.

3. A method for forming a field effect transistor and a bipolar transistor in a semiconductor comprising the steps of:
   (a) simultaneously forming doped source and drain contact regions of the field effect transistor and an emitter region of the bipolar transistor with the same doping concentration; and
   (b) forming an insulating layer on a surface portion of the semiconductor disposed between the source and drain contact regions while preventing dopant in the doped regions from entering such surface portion of the semiconductor.

4. The method recited in claim 3 including the step of forming a second insulating layer over the source and drain contact regions and wherein such second insulating layer is disposed over such source and drain contact regions during formation of the first mentioned insulating layer.

5. The method recited in claim 4 including the step of forming a gate electrode over the first mentioned insulating layer.

6. The method recited in claim 3 including the step of forming a gate electrode over the first mentioned insulating layer.

7. A method of forming a field effect device and a bipolar transistor in a semiconductor comprising the step of:
   (a) simultaneously forming source and drain contact regions of the field effect device and an emitter region of the bipolar transistor with the same doping concentration;
   (b) forming a first insulating layer over the source and drain contact regions, such layer having a space between such source and drain contact regions to expose a portion of the surface of the semiconductor between the source and drain contact regions;
   (c) forming a second insulating layer on the exposed portion of the surface of the semiconductor between the source and drain contact regions with the first insulating layer disposed over the source and drain contact regions; and
   (d) forming a gate electrode over the second insulating layer and source and drain electrodes in contact with the source and drain contact regions.

8. A method of forming a field effect device having source and drain contact regions in a semiconductor, comprising the steps of:
   (a) forming a first insulating layer over a surface of the semiconductor, such first insulating layer having a pair of spaced windows separated by a portion of the first insulating layer, such pair of windows exposing portions of the surface of the semiconductor having the source and drain contact regions;
   (b) forming a pair of spaced second insulating layers on the portions of the surface of the semiconductor exposed by the spaced windows, such pair of spaced second insulating layers covering the source and drain contact regions;
   (c) removing the portion of the first insulating layer disposed between the pair of windows exposing a portion of the surface of the semiconductor between the source and drain contact regions leaving the pair of spaced second insulating layers covering the source and drain contact regions; and
   (d) forming a third insulating layer over the portion of the surface of the semiconductor exposed by removing the portion of the first insulating layer and disposed between the pair of spaced second insulating layers with such pair of spaced second insulating layers covering the source and drain contact regions.

* * * * *

UNITED STATES PATENT OFFICE
CERTIFICATE OF CORRECTION

Patent No. 4,346,512     Dated August 31, 1982

Inventor(s) Victor K.C. Liang, Bernard Bouyssounouse and Ernest W. Yim

It is certified that error appears in the above-identified patent and that said Letters Patent are hereby corrected as shown below:

In the Abstract line 2, "compiementary" should read --complementary--;

Column 1, line 18, after "switching" insert --,-- and after "logic" insert --,--;

Column 3, lines 42-43, delete "54, 56, 58, 60, 62" and replace with --54 to 62--;

Column 3, line 45, delete "54 to 62" and replace with --54, 56, 58, 60, 62--;

Signed and Sealed this

Thirty-first Day of July 1984

[SEAL]

Attest:

GERALD J. MOSSINGHOFF

Attesting Officer

Commissioner of Patents and Trademarks